(12) United States Patent
Neef et al.

(10) Patent No.: US 7,323,289 B2
(45) Date of Patent: Jan. 29, 2008

(54) BOTTOM ANTI-REFLECTIVE COATINGS DERIVED FROM SMALL CORE MOLECULES WITH MULTIPLE EPOXY MOIETIES

(75) Inventors: Charles J. Neef, Rolla, MO (US);
Mandar Bhave, Rolla, MO (US);
Michelle Fowler, Rolla, MO (US);
Michelle Windsor, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 0 days.

(21) Appl. No.: 10/679,521

(22) Filed: Oct. 6, 2003

(65) Prior Publication Data

US 2004/0110089 A1 Jun. 10, 2004

Related U.S. Application Data

(60) Provisional application No. 60/417,214, filed on Oct. 8, 2002.

(51) Int. Cl.
*G03F 7/11* (2006.01)
*C07C 67/48* (2006.01)
*C07C 69/76* (2006.01)
*B32B 27/38* (2006.01)

(52) U.S. Cl. ............... 430/271.1; 430/325; 430/326; 430/910; 428/413; 428/414; 560/79; 560/80; 560/81; 560/84; 560/85; 560/95

(58) Field of Classification Search ............ 430/271.1, 430/325, 326, 910; 428/413, 414; 560/79, 560/80, 81, 84, 85, 95
See application file for complete search history.

(56) References Cited

U.S. PATENT DOCUMENTS

| 3,776,729 | A | * | 12/1973 | Levy et al. ............... 430/280.1 |
|---|---|---|---|---|
| 5,886,102 | A | | 3/1999 | Sinta et al. |
| 5,919,598 | A | * | 7/1999 | Flaim et al. ............. 430/271.1 |
| 5,919,599 | A | | 7/1999 | Meador et al. |
| 5,939,236 | A | | 8/1999 | Pavelchek et al. |
| 6,190,839 | B1 | | 2/2001 | Pavelchek et al. |
| 6,207,787 | B1 | | 3/2001 | Fahey et al. |
| 6,316,165 | B1 | * | 11/2001 | Pavelchek et al. .......... 430/311 |
| 6,670,425 | B2 | * | 12/2003 | Puligadda et al. ....... 525/327.3 |
| 2003/0162125 | A1 | * | 8/2003 | Deshpande .............. 430/271.1 |

OTHER PUBLICATIONS

Chemcat Abstract, AN 2002:2742256, Catalog: Interchim Intermediates, Jul. 9, 2002.*
http://matse1.mse.uiuc.edu/~tw/polymers/glos.html.*

* cited by examiner

*Primary Examiner*—Richard L. Schilling
(74) *Attorney, Agent, or Firm*—Hovey Williams LLP

(57) ABSTRACT

Novel anti-reflective coatings comprising small molecules (e.g., less than about 5,000 g/mole) in lieu of high molecular weight polymers and methods of using those coatings are provided. In one embodiment, aromatic carboxylic acids are used as the chromophores, and the resulting compounds are blended with a crosslinking agent and an acid. Anti-reflective coating films prepared according to the invention exhibit improved properties compared to high molecular weight polymeric anti-reflective coating films. The small molecule anti-reflective coatings have high etch rates and good via fill properties. Photolithographic processes carried out with the inventive material result in freestanding, 110-nm profiles.

48 Claims, 1 Drawing Sheet

BOTTOM ANTI-REFLECTIVE COATINGS DERIVED FROM SMALL CORE MOLECULES WITH MULTIPLE EPOXY MOIETIES

RELATED APPLICATIONS

This application claims the priority benefit of a provisional application entitled BOTTOM ANTI-REFLECTIVE COATINGS DERIVED FROM SMALL CORE MOLECULES WITH MULTIPLE EPOXY MOIETIES, Ser. No. 60/417,214, filed Oct. 8, 2002, incorporated by reference herein.

BACKGROUND OF THE INVENTION

1. Field of the Invention

The present invention is broadly concerned with anti-reflective coatings which comprise low molecular weight core molecules in lieu of polymeric resin binders. In one embodiment, the small core molecules comprise epoxies with chromophores bound thereto.

2. Background of the Prior Art

Integrated circuit manufacturers are consistently seeking to maximize wafer sizes and minimize device feature dimensions in order to improve yield, reduce unit case, and increase on-chip computing power. Device feature sizes on silicon chips are now submicron in size with the advent of advanced deep ultraviolet (DUV) microlithographic processes. However, reducing the substrate reflectivity to less than 1% during photoresist exposure is critical for maintaining dimension control of such submicron features. Therefore, light absorbing organic polymers known as anti-reflective coatings are applied beneath photoresist layers in order to reduce the reflectivity normally encountered from the semiconductor substrates during the photoresist DUV exposure.

Prior art anti-reflective coating layers contain a polymeric resin with a light-absorbing chromophore either attached to, or blended with, the resin. Although high optical densities enable these polymers to provide effective reflectivity control, they also have numerous drawbacks. For example, these polymers have high molecular weights which cause problems during polymer blending. More particularly, the use of these polymers inhibits customization of the anti-reflective coating to the photoresist being utilized in the particular photolithographic process. Customization is extremely important because it allows for straighter profiles and better adhesion of the photoresist to the anti-reflective coating, thus resulting in better performance.

There is a need for new anti-reflective coatings which minimize or avoid the problems associated with prior art polymeric anti-reflective coatings.

SUMMARY OF THE INVENTION

The present invention overcomes the problems associated with prior art coatings by broadly providing coating compositions which comprise low molecular weight components.

In more detail, the inventive compositions comprise a plurality of components, compounds, ingredients, etc., dissolved or dispersed in a solvent system. At least about 95%, preferably at least about 98%, and even more preferably at least about 100% of these components have a molecular weight of less than about 5,000 g per mole of component, preferably less than about 2,000 g per mole of component, and even more preferably less than about 1,000 g per mole of component. These low molecular weight components are used in lieu of the polymeric resins typically present in anti-reflective coatings, thus avoiding the problems typically associated with polymer blending.

In one embodiment, the anti-reflective coating compositions include a compound comprising at least two epoxy moieties which are each individually bonded with respective light attenuating moieties. Even more preferably, the compound comprises three or more epoxy moieties bonded with respective light attenuating moieties. Examples of preferred precursor compounds which include at least two epoxy moieties for subsequent bonding with light attenuating moieties include the following:

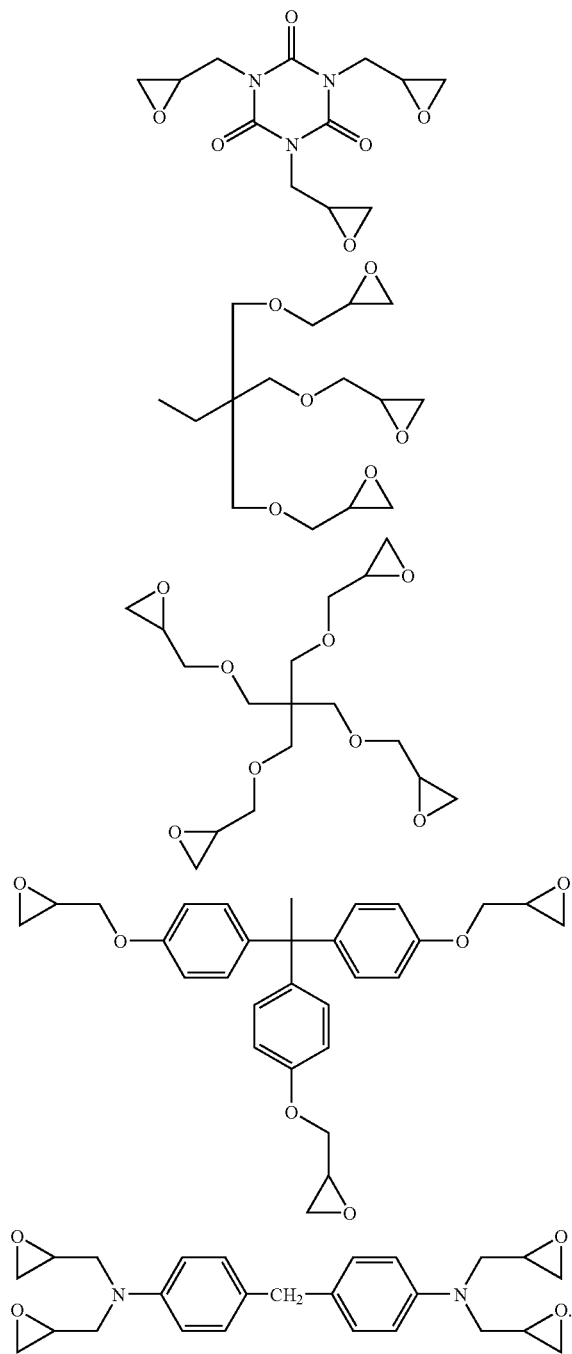

The light attenuating moieties utilized preferably comprise a chromophore having carboxylic acid portion for bonding with an epoxy. Preferred chromophores include cyclic compounds (and particularly aromatics) and aliphatic (preferably $C_1$-$C_{12}$, and more preferably $C_1$-$C_8$) acids. Examples of preferred precursor compounds to act as light attenuating moieties according to the invention include:

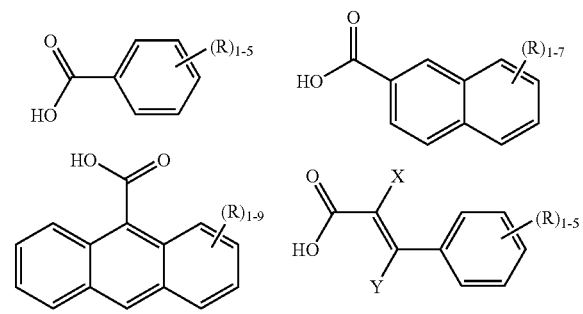

where each of R, X, and/or Y is individually selected from the group consisting of alkyl (preferably $C_1$-$C_{12}$, and more preferably $C_1$-$C_8$), aryl (preferably $C_4$-$C_{20}$, and more preferably $C_6$-$C_{14}$), ether, cyano, nitro, sulfonyl, sulfone, sulfonate, chloro, fluoro, bromo, iodo, carbonyl, amino, and thioether groups.

The inventive low molecular weight compound is formed by reacting the precursor epoxy compound with the precursor light attenuating compound in the presence of a solvent and usually a catalyst. One such reaction is shown below.

Scheme A

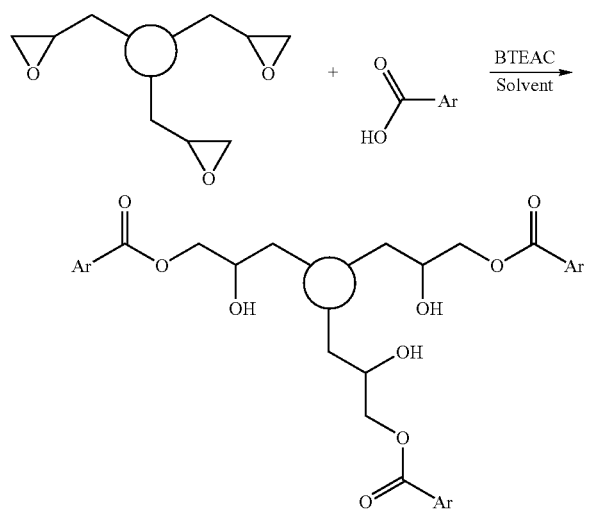

Thus, in one embodiment, the inventive compounds will have the following generic formula:

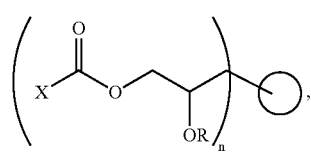

(I)

where each X is a chromophore, each R is selected from the group consisting of hydrogen and $C_1$-$C_8$ alkyl groups, and n is at least 2 (more preferably at least 3). X is preferably selected from the group consisting of benzene, anthracene, naphthalene, and alkyls (preferably $C_1$-$C_{12}$, and more preferably $C_1$-$C_8$).

In this formula, the structure of the portion represented by

(II)

is not critical so long as it is capable of bonding with two or more of the groups

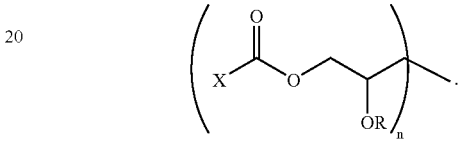

Preferred (II) groups include those selected from the group consisting of cyclic, acyclic, aliphatic, and aromatic compounds, and functional moieties of the foregoing. As used herein, references to a particular compound to describe a portion of a structure is intended to refer to the compound referenced as well as to functional moieties of the structure. The term "functional moiety" refers to a moiety of a compound whose structure has been altered so that it may bond with another compound. For example, a functional moiety of benzene would include a benzene ring where one or more hydrogen atoms have been removed so that a carbon atom of the benzene ring can bond with another compound or moiety.

Regardless of the embodiment, these compounds can be utilized to make compositions (e.g., anti-reflective coatings) for use in microlithographic processes. The compositions are formed by simply dispersing or dissolving the compound(s) in a suitable solvent system, preferably at ambient conditions and for a sufficient amount of time to form a substantially homogeneous dispersion. Preferred compositions comprise from about 1-50% by weight of the compound, and preferably from about 2-20% by weight of the compound, based upon the total weight of solids in the composition taken as 100% by weight.

The solvent systems can include any solvent suitable for use in the microelectronic manufacturing environment. Preferred solvent systems include a solvent selected from the group consisting of propylene glycol monomethyl ether (PGME), propylene glycol monomethyl ether acetate (PGMEA), ethyl lactate, propylene glycol n-propyl ether (PnP), cyclohexanone, tetrahydrofuran (THF), dimethyl formamide (DMF), γ-butyrolactone, and mixtures thereof. Preferably, the solvent system has a boiling point of from about 100-200° C.

Any additional ingredients are also preferably dispersed in the solvent system along with the compound. Examples of suitable additional ingredients include crosslinking agents, catalysts, and surfactants. Preferred crosslinking agents include aminoplasts (e.g., POWDERLINK® 1174, Cymel® products), multifunctional epoxy resins (e.g., MY720, CY179MA, DENACOL), anhydrides, and mixtures thereof.

The crosslinking agent should be present in the composition at a level of less than about 25% by weight, and preferably from about 0.05-10% by weight, based upon the total weight of solids in the composition taken as 100% by weight. Thus, the compositions of the invention should crosslink at a temperature of from about 100-250° C., and more preferably from about 150-205° C.

Examples of preferred catalysts include sulfonic acids (e.g., p-toluenesulfonic acid, styrene sulfonic acid), thermal acid generators (e.g., pyridinium tosylate), carboxylic acids (e.g., trichloroacetic acid, benzene tetracarboxylic acid), and mixtures thereof. The catalyst should be present in the composition at a level of less than about 10% by weight, and preferably from about 0.01-5% by weight, based upon the total weight of solids in the composition taken as 100% by weight.

The method of applying the inventive anti-reflective compositions to a substrate (e.g., Si, Al, W, WSi, GaAs, SiGe, Ge, Ta, and TaN wafers) simply comprises applying a quantity of a composition hereof to the substrate surface (either a planar surface or one comprising vias or holes formed therein) by any conventional application method, including spin-coating. The layer should then be heated to at least about the crosslinking temperature of the composition (e.g., about 150-205° C.) so as to cure or harden the layer having a thickness of anywhere from about 100-5,000 Å where the thickness is defined as the average of 5 measurements taken by an ellipsometer. A photoresist can then be applied to the cured material, followed by exposing, developing, and etching of the photoresist.

Anti-reflective coatings according to the invention have high etch rates. Thus, the cured anti-reflective coatings have an etch rate of at least about 10 Å/second, and preferably from about 11-15 Å/second when $CF_4$ gas is used as the etchant. Additionally, at about 193 nm a cured layer formed from the inventive composition and having a thickness of about 320 Å will have a k value (i.e., the imaginary component of the complex index of refraction) of at least about 0.40, and preferably at least about 0.50, and an n value (i.e., the real component of the complex index of refraction) of at least about 1.5, and preferably at least about 1.7. That is, the cured coatings will absorb at least about 95% of light at wavelengths of about 157, 193, 248, and 365 nm and at a layer thickness of about 320 Å. The coatings can be used to obtain a resolution of less than about 150 μm and preferably less than about 100 μm in 193 nm photoresists.

When the inventive anti-reflective coating compositions are subjected to a spin bowl compatibility test, they will achieve a result of at least about 90%, and preferably at least about 95%. As used herein, the spin bowl compatibility is determined by coating a wafer with the composition. After coating, the wafers are not baked, but are instead placed in a wafer cassette. The coated surfaces are positioned upward in order to prevent film flow, and the samples are allowed to dry for about 24 hours in a clean room (ambient conditions) to yield films around 1300 Å thick. The sample thickness is measured on each wafer and is designated as the initial sample thickness.

The coated wafer is then exposed to a test solvent such as PGMEA. This is accomplished by centering a sample wafer on a spinner, followed by coating with the solvent evenly over the entire surface of the wafer. The sample is allowed to soak for 3 minutes followed by spinning dry for about 1 second at about 1500 rpm. After spinning, the thickness of the sample on the wafer is measured and designated as the final thickness.

The percent solubility is then calculated as follows:

$$\% \text{ solubility} = \left[\frac{(\text{initial sample thickness} - \text{final sample thickness})}{(\text{initial sample thickness})}\right] * 100.$$

Finally, cured anti-reflective layers according to the invention are also substantially insoluble in solvents (e.g., ethyl lactate, PGMEA) typically utilized in the photoresist layer which is subsequently applied to the anti-reflective layer. That is, the thickness of the layer will change by less than about 10%, and preferably less than about 1% after contact (for about 20 seconds) with the photoresist solvent. As used herein, the percent change is defined as:

$$100 \cdot \frac{|(\text{thickness prior to solvent contact}) - (\text{thickness after solvent contact})|}{(\text{thickness prior to solvent contact})}$$

DETAILED DESCRIPTION OF THE PREFERRED EMBODIMENTS

EXAMPLES

Figure 1:
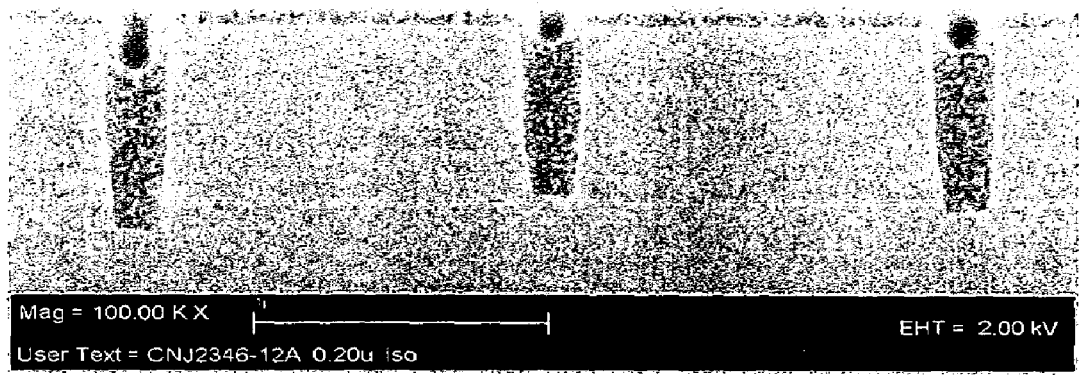
FIG. 1 is a scanning electron microscope (SEM) photograph showing a cross-sectional view of a wafer prepared by a dual damascene process and utilizing the inventive anti-reflective coating composition.

The following examples set forth preferred methods in accordance with the invention. It is to be understood, however, that these examples are provided by way of illustration and nothing therein should be taken as a limitation upon the overall scope of the invention. Aromatic carboxylic acids were grafted to a core molecule with multiple epoxy moieties. This material was then blended with a crosslinking agent (e.g., Powderlink®, Cymel®, epoxies) and an acid catalyst (e.g., toluene sulfonic acid, pyridinium tosylate, etc.) to formulate an anti-reflective coating.

Example 1

4-Hydroxybenzoic Acid Grafted to Tris(2,3-Epoxypropyl)Isocyanurate

1. Preparation of Mother Liquor

Tris(2,3-epoxypropyl)isocyanurate (17.84 g), 4-hydroxybenzoic acid (24.86 g), benzyltriethylammonium chloride (1.03 g), and propylene glycol n-propyl ether (384.3 g) were added to a round bottom flask. A nitrogen atmosphere was established, and the reaction was heated at 120° C. for 16 hours. The solution was allowed to cool and was then bottled.

2. Preparation of Anti-Reflective Coating

The mother liquor (20 g) prepared in Part 1 of this example was blended with Powderlink® 1174 (0.50 g, a crosslinking agent available from Cytec Industries), p-toluene sulfonic acid (0.06 g), propylene glycol n-propyl ether (10.84 g), and ethyl lactate (28.84 g). The solution was filtered through a 0.1-μm PTFE filter prior to use.

Example 2

3-Chlorobenzoic Acid Grafted to Tris(2,3-Epoxypropyl)Isocyanurate

1. Preparation of Mother Liquor

Tris(2,3-epoxypropyl)isocyanurate (2.97 g), 3-chlorobenzoic acid (4.70 g), benzyltriethylammonium chloride (0.17 g), and propylene glycol n-propyl ether (69.03 g) were added to a round bottom flask. A nitrogen atmosphere was established, and the reaction was heated at 120° C. for 16 hours. The solution was allowed to cool and was then bottled.

2. Preparation of Anti-Reflective Coating

The mother liquor (20 g) prepared in Part 1 of the example was blended with Powderlink® 1174 (0.50 g), p-toluene sulfonic acid (0.06 g), propylene glycol n-propyl ether (10.84 g), and ethyl lactate (28.84 g). The solution was filtered through a 0.1-μm PTFE filter prior to use.

Example 3

Benzoic Acid and 4-Hydroxybenzoic Acid Grafted to Tris(2,3-Epoxypropyl)Isocyanurate 1. Preparation of Mother Liquor Tris(2,3-epoxypropyl)isocyanurate (2.97 g), benzoic acid (1.83 g), 4-hydroxybenzoic acid (2.07 g), benzyltriethylammonium chloride (0.17 g), and propylene glycol n-propyl ether (61.83 g) were added to a round bottom flask. A nitrogen atmosphere was established, and the reaction was heated at 120° C. for 16 hours. The solution was allowed to cool and was then bottled.

2. Preparation of Anti-Reflective Coatings

The mother liquor (20 g) prepared in Part 1 of this example was blended with Powderlink® 1174 (0.50 g), p-toluene sulfonic acid (0.06 g), propylene glycol n-propyl ether (10.84 g), and ethyl lactate (28.84 g). The solution was filtered through a 0.1-μm PTFE filter prior to use.

Example 4

3,7-Dihydroxynaphthoic Acid Grafted to Tris(2,3-Epoxypropyl)Isocyanurate

1. Preparation of Mother Liquor

Tris(2,3-epoxypropyl)isocyanurate (5.95 g), 3,7-dihydroxynaphthoic acid (12.25 g), benzyltriethylammonium chloride (0.34 g), and propylene glycol n-propyl ether (163.8 g) were added to around bottom flask. A nitrogen atmosphere was established, and the reaction was heated at 120° C. for 16 hours. The solution was allowed to cool and was then bottled.

2. Preparation of Anti-Reflective Coating

The mother liquor (10 g) prepared in Part 1 was blended with Powderlink® 1174 (0.50 g), p-toluene sulfonic acid (0.03 g), and propylene glycol n-propyl ether (21.72 g). The solution was filtered through a 0.1-μm PTFE filter prior to use.

Example 5

α-Cyano-4-Hydroxycinnamic Acid Grafted to Trimethylolpropane Triglycidyl Ether

1. Preparation of Mother Liquor

Trimethylolpropane triglycidyl ether (6.05 g), α-cyano-4-hydroxycinnamic acid (11.35 g), benzyltriethylammonium chloride (0.34 g), and propylene glycol n-propyl ether (156.6 g) were added to a round bottom flask. A nitrogen atmosphere was established, and the reaction was heated at 120° C. for 16 hours. The solution was allowed to cool and was then bottled.

2. Preparation of Anti-Reflective Coating

The mother liquor (20 g) prepared in Part 1 of this example was blended with Powderlink® 1174 (0.50 g), p-toluene sulfonic acid (0.06 g), propylene glycol n-propyl ether (10.84 g), and ethyl lactate (28.84 g). The solution was filtered through a 0.1-μm PTFE filter prior to use.

Example 6

Determination of Anti-Reflective Film Properties

The tests described below were carried out on each of the formulations prepared in Example 1-5.

1. Film Stripping Test

Each formulation was applied to a 4-inch silicon wafer and baked at 205° C. for seconds. After measuring the film thicknesses with an ellipsometer, the film was sprayed with ethyl lactate or PGMEA. The resulting puddle was allowed to stand for 20 seconds followed by spin drying at 2000 rpm for 30 seconds. The film thickness was then remeasured. The results from the film stripping test are given in Table 1. The loss in film thickness was minimal, showing good strip resistivity by the films.

TABLE 1

Results of Film Stripping Test

| FORMULATION (EXAMPLE NO.) | SOLVENT | Δ FILM THICKNESS (Å) |
|---|---|---|
| 1 | ethyl lactate | 0 |
| 1 | PGMEA | 0 |
| 2 | ethyl lactate | −1 |
| 2 | PGMEA | −3 |
| 3 | ethyl lactate | 0 |
| 3 | PGMEA | 0 |
| 4 | ethyl lactate | 0 |
| 5 | ethyl lactate | 0 |

2. Interlayer Test

Each formulation was applied to A 4-inch silicon wafer and baked at 205° C. for 60 seconds. The film thickness was measured with an ellipsometer. A commercially available photoresist was applied to the film, and a post-application bake (130° C. for 90 seconds) was performed. The resist was exposed to light followed by a post-exposure bake (130° C. for 90 seconds). After removal of the photoresist with 0.26 N tetramethylammonium hydroxide (TMAH) developer, the film thickness was remeasured. The difference between the final thickness and the initial thickness of the film determined the amount of interlayer. The results of this test are shown in Table 2.

TABLE 2

Results of Interlayer Test

| FORMULATION (EXAMPLE NO.) | PHOTORESIST | INTERLAYER THICKNESS (Å) |
|---|---|---|
| 1 | PAR811[a] | 13 |
| 2 | PAR811 | 60 |
| 3 | PAR811 | 10 |
| 5 | OIR620-09[b] | 120 |

[a]Available from Sumitomo.
[b]Available from Fuji Film Arch.

3. Spin Bowl Compatibility Test

This test was carried out by applying the formulations to six, 4-inch silicon wafers followed by air drying of the films for 24 hours at ambient conditions. The thickness of the film was measured with an ellipsometer. Each wafer was flooded with a different solvent (acetone, PGMEA, PGME, 2-heptanone, cyclohexanone, and ethyl lactate) for 180 seconds, and was then spun dry. The final film thickness was measured. If more than 90 percent of the film was removed, the sample was determined to be spin bowl compatible with a solvent. Each of the formulations was found to be spin bowl compatible with each of the solvents tested.

4. Variable Angle Spectrophotometric Ellipsometer (V.A.S.E.) Measurements:

Each of the formulations was applied to a 4-inch silicon wafer, and the refractive index of each was measured with a V.A.S.E. The results of these measurements (real refractive index, n, and imaginary refractive index, k) are listed in Table 3. From these results, it can be seen that the optics can be varied, and that this system can be used for various wavelengths of lithography.

TABLE 3

Refractive Indices

| FORMULATION (EXAMPLE NO.) | WAVELENGTH (nm) | n | k |
|---|---|---|---|
| 1 | 193 | 1.69 | 0.45 |
| 2 | 193 | 1.52 | 0.48 |
| 3 | 193 | 1.70 | 0.57 |
| 4 | 248 | 1.81 | 0.48 |

5. Etching

This test was carried out by applying each of the formulations to a 4-inch silicon wafer and then measuring the thickness of each film with an ellipsometer. Each coated wafer was placed into a Trion Etcher and etched with $CF_4$ gas at a 40 sccm flow rate, at 50 watts of power and 50 mtorr of pressure. After etching, the film thickness was remeasured. The etch rate was the difference between initial thickness and the final thickness divided by the etch time. The results are given in Table 4.

TABLE 4

Etch Rates with $CF_4$ Gas

| Formulation | Etch Rate (Å/sec.) |
|---|---|
| 1 | 11.20 |
| 2 | 12.26 |
| 3 | 11.14 |

6. Dual Damascene

The formulation prepared in Example 1 was spin-coated onto a 6-inch via wafer and baked at 205° C. A cross-sectional view of the sample wafer is shown in FIG. 1.

7. Photolithography

Figure 2:
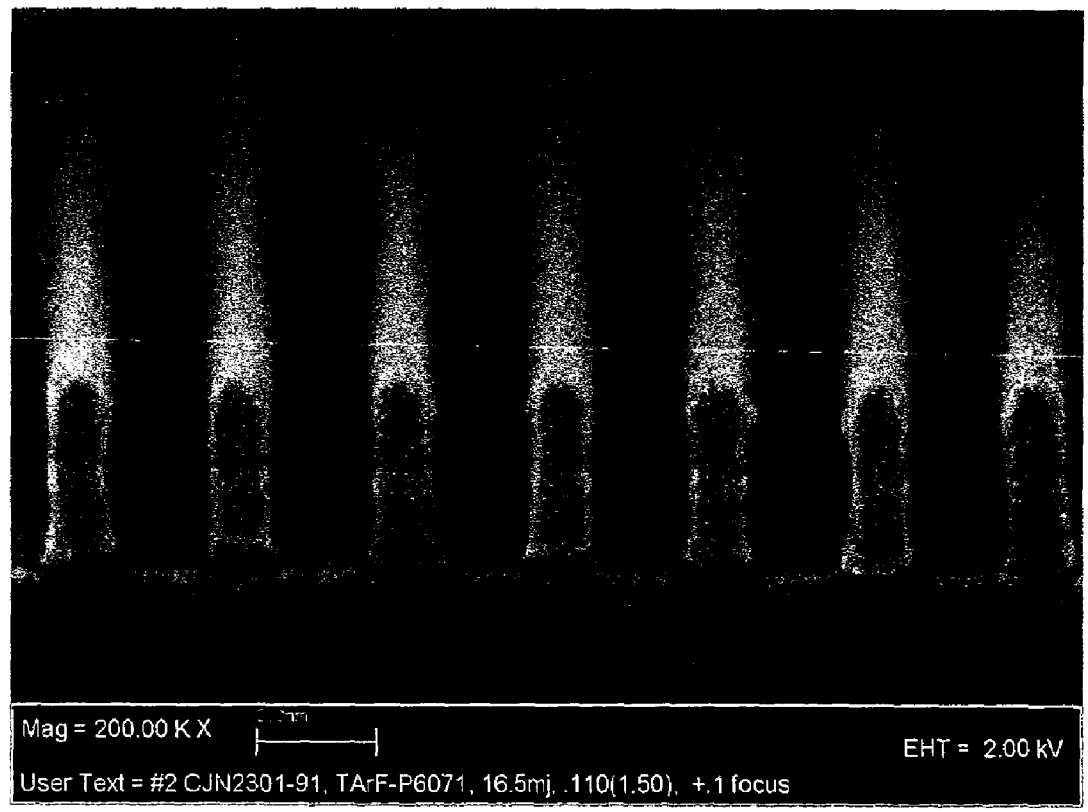
FIG. 2 shows an SEM photograph depicting a cross-sectional view of a wafer prepared utilizing an anti-reflective coating composition according to the invention.

The formulation prepared in Example 1 was spin-coated onto an 8-inch silicon wafer and baked at 205° C. for 60 seconds to produce a film with a thickness of 35 nm. A commercially available photoresist (TArF-P6071, available from TOK) was applied to the film followed by a post-application bake of 120° C. for 90 seconds. The photoresist was patterned with lines and spaces with an ASML PA5500/900, followed by a post-exposure bake of 120° C. for 90 seconds and development of the photoresist. A cross-sectional view of the sample wafer is shown in FIG. 2.

We claim:

1. In an anti-reflective composition for attenuating light during lithography processes, said composition comprising a plurality of components dissolved or dispersed in a solvent system, the improvement being that:
   at least about 95% of said components in said anti-reflective composition are non-polymeric and have a molecular weight of less than 1,000 g per mole of component; and
   said composition comprises a first compound having at least two epoxy moieties reacted with respective light attenuating compounds.

2. The composition of claim 1, wherein at least about 98% of said components have a molecular weight of less than 1,000 g per mole of component.

3. The composition of claim 1, wherein said light attenuating compounds comprise respective carboxylic acid groups bonded with respective chromophores.

4. The composition of claim 3, wherein said chromophores comprise cyclic groups.

5. The composition of claim 4, wherein said chromophores comprise aromatic groups.

6. The composition of claim 1, wherein said first compound comprises at least two moieties having the formula

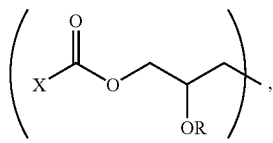

where:
  each X is a chromophore; and
  each R is selected from the group consisting of hydrogen and $C_1$-$C_8$ alkyl groups.

7. The composition of claim 6, wherein the first compound has the formula

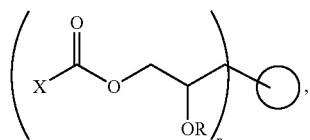

where

is selected from the group consisting of cyclic, acyclic, aliphatic, and aromatic components, and functional moieties of the foregoing, and n is at least 2.

8. The composition of claim 6, wherein said first compound has the formula

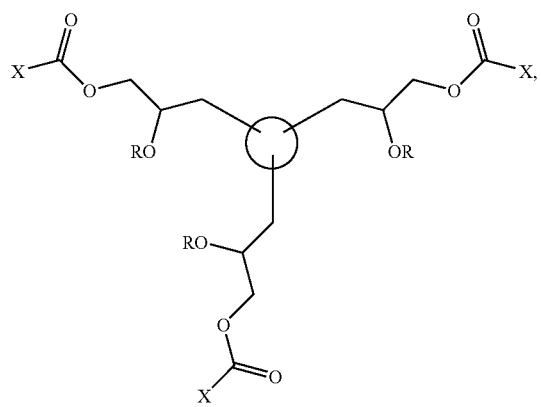

where

is selected from the group consisting of cyclic, acyclic, aliphatic, and aromatic components, and functional moieties of the foregoing.

9. The composition of claim 6, wherein X is selected from the group consisting of benzene, anthracene, naphthalene, and alkyls.

10. The composition of claim 1, wherein said composition further comprises an ingredient selected from the group consisting of surfactants, crosslinking agents, catalysts, and mixtures thereof.

11. The composition of claim 10, wherein said ingredient is a crosslinking agent selected from the group consisting of aminoplasts, epoxy resins, anhydrides, and mixtures thereof.

12. The composition of claim 10, wherein said ingredient is a catalyst selected from the group consisting of sulfonic acids, thermal acid generators, carboxylic acids, and mixtures thereof.

13. The composition of claim 1, wherein said solvent system includes a solvent selected from the group consisting of propylene glycol monomethyl ether, propylene glycol monomethyl ether acetate, ethyl lactate, propylene glycol n-propyl ether, cyclohexanone, tetrahydrofuran, dimethyl formamide, γ-butyrolactone, and mixtures thereof.

14. In an anti-reflective composition for attenuating light during lithography processes, said composition comprising a plurality of components dissolved or dispersed in a solvent system, the improvement being that said composition comprises a non-polymeric compound having at least two moieties having the formula

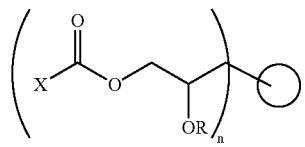

where:
each X is a chromophore;
each R is selected from the group consisting of hydrogen and $C_1$-$C_8$ alkyl groups; and

is selected from the group consisting of cyclic, acyclic, aliphatic, and aromatic components, and functional moieties of the foregoing, and n is at least 2.

15. The composition of claim 14, wherein at least about 98% of said components have a molecular weight of less than about 5,000 g per mole of component.

16. The composition of claim 14, wherein said compound has a molecular weight of less than about 5,000 g per mole.

17. The composition of claim 14, wherein said compound has the formula

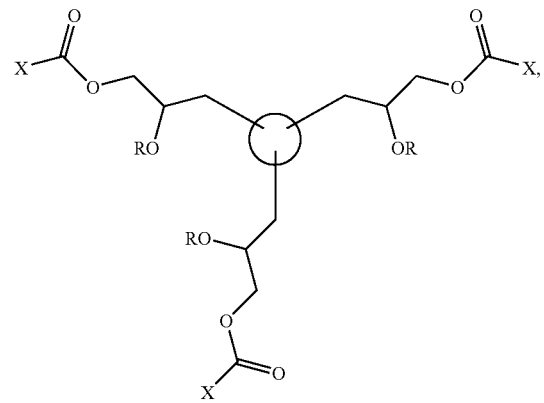

where

is selected from the group consisting of cyclic, acyclic, aliphatic, and aromatic components, and functional moieties of the foregoing.

18. The composition of claim 14, wherein X is selected from the group consisting of benzene, anthracene, naphthalene, and alkyls.

19. The composition of claim 14, wherein said composition further comprises an ingredient selected from the group consisting of crosslinking agents, catalysts, and mixtures thereof.

20. The composition of claim 14, wherein said solvent system includes a solvent selected from the group consisting of propylene glycol monomethyl ether, propylene glycol monomethyl ether acetate, ethyl lactate, propylene glycol n-propyl ether, cyclohexanone, tetrahydrofuran, dimethyl formamide, γ-butyrolactone, and mixtures thereof.

21. A method of using a composition in lithographic processes, said method comprising the step of applying a quantity of a composition to a substrate to form a layer thereon, wherein said substrate has a hole formed therein and defined by a bottom wall and sidewalls, and said applying step comprises applying said composition to at least a portion of said bottom wall and side walls, said composition comprising:
   a solvent system; and
   a plurality of components dissolved or dispersed in said solvent system, said components including a compound comprising at least two epoxy moieties reacted with respective light attenuating compounds, the improvement being that at least about 95% of the components in the composition are non-polymeric and have a molecular weight of less than 1,000 g per mole of component.

22. The method of claim 21, further including the step of baking said layer at a temperature of from about 100-250° C. to yield a cured or hardened layer.

23. The method of claim 22, further including the step of applying a photoresist to said cured or hardened layer.

24. The method of claim 23, furthering including the steps of:
   exposing at least a portion of said photoresist to light; and
   developing said exposed photoresist.

25. The method of claim 21, wherein said substrate is selected from the group consisting of silicon, aluminum, tungsten, tungsten silicide, gallium arsenide, germanium, tantalum, SiGe, and tantalum nitride wafers.

26. The method of claim 21, wherein said compound comprises at least two moieties having the formula

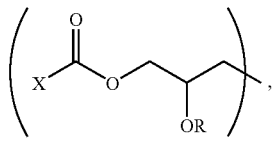

where:
   each X is a chromophore; and
   each R is selected from the group consisting of hydrogen and $C_1$-$C_8$ alkyl groups.

27. A method of using a composition in lithographic processes, said method comprising the step of applying a quantity of a composition to a substrate to form a layer thereon, said composition comprising:
   a solvent system; and
   a non-polymeric compound dispersed or dissolved in said solvent system, said compound having at least two moieties having the formula

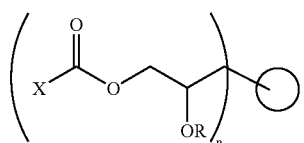

where:
   each X is a chromophore;
   each R is selected from the group consisting of hydrogen and $C_1$-$C_8$ alkyl groups; and

is selected from the group consisting of cyclic, acyclic, aliphatic, and aromatic components, and functional moieties of the foregoing, and n is at least 2.

28. The method of claim 27, wherein said substrate has a hole formed therein, said hole being defined by a bottom wall and sidewalls, and said applying step comprises applying said composition to at least a portion of said bottom wall and sidewalls.

29. The method of claim 27, further including the step of baking said layer at a temperature of from about 100-250° C. to yield a cured or hardened layer.

30. The method of claim 29, further including the step of applying a photoresist to said cured or hardened layer.

31. The method of claim 30, furthering including the steps of:
   exposing at least a portion of said photoresist to light; and
   developing said exposed photoresist.

32. The method of claim 27, wherein said substrate is selected from the group consisting of silicon, aluminum, tungsten, tungsten silicide, gallium arsenide, germanium, tantalum, SiGe, and tantalum nitride wafers.

33. The method of claim 27, wherein said composition comprises a plurality of components dissolved or dispersed in said solvent system and at least about 98% of said components have a molecular weight of less than about 5,000 g per mole of component.

34. The method of claim 27, wherein said compound has a molecular weight of less than about 5,000 g per mole.

35. The method of claim 27, wherein said compound has the formula

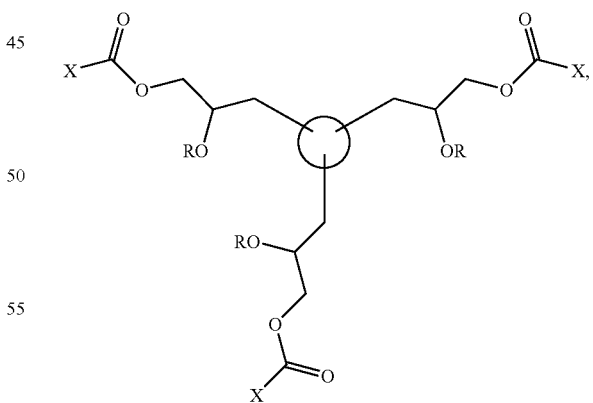

where

is selected from the group consisting of cyclic, acyclic, aliphatic, and aromatic components, and functional moieties of the foregoing.

36. The method of claim 27, wherein X is selected from the group consisting of benzene, anthracene, naphthalene, and alkyls.

37. The method of claim 27, wherein said composition further comprises an ingredient selected from the group consisting of crosslinking agents, catalysts, and mixtures thereof.

38. A precursor structure formed during photolithographic processes, said structure comprising:
   a substrate having a surface;
   an anti-reflective layer on said substrate surface, said layer being formed from a composition comprising:
      a solvent system; and
      a plurality of components dissolved or dispersed in said solvent system, said components including a compound comprising at least two epoxy moieties reacted with respective light attenuating compounds, the improvement being that at least about 95% of the components in the composition are non-polymeric and have a molecular weight of less than 1,000 g per mole of component,
   wherein said layer absorbs at least about 95% of light at a wavelength of about 193 nm and at a layer thickness of about 320 Å.

39. The structure of claim 38, further including a photoresist adjacent said anti-reflective layer.

40. The structure of claim 38, wherein said substrate is selected from the group consisting of silicon, aluminum, tungsten, tungsten silicide, gallium arsenide, germanium, tantalum, SiGe, and tantalum nitride wafers.

41. A precursor structure formed during photolithographic processes, said structure comprising:
   a substrate having a surface;
   an anti-reflective layer on said substrate surface, said layer being formed from a composition comprising:
      a solvent system; and
      a non-polymeric compound dispersed or dissolved in said solvent system, said compound having at least two moieties having the formula

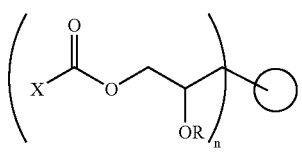

where:
   each X is a chromophore;
   each R is selected from the group consisting of hydrogen and $C_1$-$C_8$ alkyl groups; and

is selected from the group consisting of cyclic, acyclic, aliphatic, and aromatic components, and functional moieties of the foregoing, and n is at least 2.

42. The structure of claim 41, further including a photoresist adjacent said anti-reflective layer.

43. The structure of claim 41, wherein said layer absorbs at least about 95% of light at a wavelength of about 193 nm and at a layer thickness of about 320 Å.

44. The structure of claim 41, wherein said substrate is selected from the group consisting of silicon, aluminum, tungsten, tungsten silicide, gallium arsenide, germanium, tantalum, SiGe, and tantalum nitride wafers.

45. A non-polymeric compound having at least three moieties having the formula

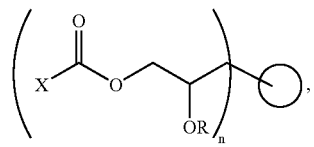

where:
   each X is a chromophore;
   each R is selected from the group consisting of hydrogen and $C_1$-$C_8$ alkyl groups; and

is selected from the group consisting of cyclic, acyclic, aliphatic, and aromatic components, and functional moieties of the foregoing, and n is at least 3.

46. The compound of claim 45, wherein said compound has a molecular weight of less than about 5,000 g per mole.

47. The compound of claim 45, wherein said compound has the formula

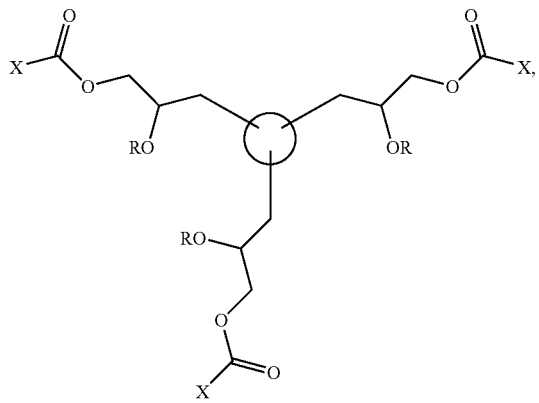

where

is selected from the group consisting of cyclic, acyclic, aliphatic, and aromatic components, and functional moieties of the foregoing.

48. The compound of claim 45, wherein X is selected from the group consisting of benzene, anthracene, naphthalene, and alkyls.

* * * * *